United States Patent
Hayashi et al.

(10) Patent No.: US 6,366,172 B1
(45) Date of Patent: Apr. 2, 2002

(54) SEMICONDUCTOR AMPLIFIER CIRCUIT AND SYSTEM

(75) Inventors: Joji Hayashi, Osaka; Hiroshi Kimura, Hyogo, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/701,686

(22) PCT Filed: Jul. 6, 1999

(86) PCT No.: PCT/JP99/03648

§ 371 Date: Mar. 30, 2001

§ 102(e) Date: Mar. 30, 2001

(87) PCT Pub. No.: WO00/02307

PCT Pub. Date: Jan. 13, 2000

(30) Foreign Application Priority Data

Jul. 7, 1998 (JP) .......................................... 10-192156

(51) Int. Cl.[7] ............................................... H03F 3/04
(52) U.S. Cl. ........................ 330/311; 330/253; 333/217
(58) Field of Search ........................... 330/311; 333/217

(56) References Cited

U.S. PATENT DOCUMENTS

| 3,443,238 A | * | 5/1969 | Fynn et al. ................ 330/18 |
| 4,250,463 A | * | 2/1981 | Foster ..................... 330/298 |
| 5,451,906 A | | 9/1995 | Kaltenecker |
| 6,137,367 A | * | 10/2000 | Ezzedine et al. ........... 330/311 |

FOREIGN PATENT DOCUMENTS

| JP | 55-35864 | 9/1980 |
| JP | 1-198817 | 8/1989 |
| JP | 6-224647 | 8/1994 |
| JP | 9-270645 | 10/1997 |

* cited by examiner

Primary Examiner—Robert Pascal
Assistant Examiner—Henry Choe
(74) Attorney, Agent, or Firm—Snell & Wilmer L.L.P.

(57) ABSTRACT

The present invention has an objective of providing a semiconductor amplifier circuit having a cascode amplifier in which a negative characteristic of an output conductance is improved at least in a particular frequency band. A semiconductor amplifier 1 includes a cascode amplifier 500 having a transistor 101 and a transistor 102 which are cascaded, and improvement means for improving the negative characteristic of the output conductance $G_{out}$ of the cascode amplifier 500 at least in a particular frequency band.

6 Claims, 13 Drawing Sheets

SEMICONDUCTOR AMPLIFIER CIRCUIT AND SYSTEM

TECHNICAL FIELD

The present invention relates to a semiconductor amplifier circuit and system including a cascode amplifier.

PRIOR ART

FIG. 3 illustrates an arrangement of a conventional semiconductor amplifier circuit 10. The semiconductor amplifier circuit 10 amplifies an input signal $V_{IN}$ input to an input terminal IN and outputs the result to an output terminal OUT as an output signal $V_{OUT}$.

The semiconductor amplifier circuit 10 includes a transistor 101. The gate of the transistor 101 is connected to the input terminal IN. The source of the transistor 101 is grounded. The drain of the transistor 101 is connected to the output terminal OUT. The drain of the transistor 101 is supplied with a power supply voltage $V_{dd}$ via a load ZL.

FIG. 5 illustrates the results of a simulation of the operation of the semiconductor amplifier circuit 10 shown in FIG. 3. Such a simulation is performed by using HSPICE, for example. The conditions for the simulation are as follows:

Transistor 101: nMOS transistor
Frequency f of input signal $V_{IN}$: 1 kHz
Load ZL: resistor of 1000Ω
Output conductance gds of transistor 101: 1 mS
Transconductance gm of transistor 101: 24 mS As shown in FIG. 5, through the semiconductor amplifier circuit 10, an output signal $V_{OUT}$ is obtained by amplifying the input signal $V_{IN}$ by a factor of 12 (=ZL×gm/2).

However, in the structure of the semiconductor amplifier circuit 10, the feedback capacitance $C_{gd}$ appears to be increased by a factor of about 12 as compared to effective capacitance due to a Miller effect. Thus, a larger current flows from the input terminal IN to the output terminal OUT as the frequency of the input signal $V_{IN}$ increases.

FIG. 4 illustrates the structure of a conventional semiconductor amplifier circuit 20 for reducing the Miller effect.

The semiconductor amplifier circuit 20 includes a cascode amplifier 500. The cascode amplifier 500 includes the transistor 101 and a transistor 102 which are cascaded.

The gate of the transistor 101 is connected to an input terminal IN of the semiconductor amplifier circuit 20. The source of the transistor 101 is grounded. The drain of the transistor 101 is connected to the source of the transistor 102.

The gate of the transistor 102 is supplied with a fixed voltage $V_b$. The fixed voltage $V_b$ is supplied from, for example, a DC power supply (not shown). A bypass capacitor $C_1$ is provided for removing an AC component of the voltage $V_b$ supplied from the DC power supply.

The source of the transistor 102 is connected to the drain of the transistor 101. The drain of the transistor 102 is connected to an output terminal OUT of the semiconductor amplifier circuit 20. The drain of the transistor 102 is supplied with the power supply voltage $V_{dd}$ via the load ZL.

FIG. 6 illustrates the results of a simulation of a drain voltage $V_1$ of the transistor 101 (i.e., a source voltage of the transistor 102). Due to the cascode arrangement in which the transistor 101 and the transistor 102 are cascaded, the amplitude of the voltage $V_1$ is approximately equal to that of the input voltage $V_{IN}$. Thus, there is no large current between the input terminal IN and the drain of the transistor 101. As a result, the Miller effect is reduced.

The above-described cascode arrangement also enables one to obtain a large amount of electric power as the output of the transistor amplifier circuit 20. This will be discussed below.

Generally, the maximum output power $P_{OUT}$ of an amplifier is expressed by (Expression 1):

$$P_{OUT} \sim (gm \cdot V_{IN})^2 / G_{OUT} \qquad \text{(Expression 1)}$$

where gm represents a transconductance of the amplifier, $V_{IN}$ represents a voltage of an input signal input to the amplifier, and $G_{OUT}$ represents an output conductance of the amplifier.

As will be appreciated from (Expression 1), $P_{OUT}$ is inversely proportional to $G_{OUT}$.

As shown in FIG. 3, if the amplifier has a single transistor arrangement, $G_{OUT}$=gds. Accordingly, by substituting $G_{OUT}$=gds into (Expression 1), $P_{OUT}$=$(gm \cdot V_{IN})^2$/ gds holds. On the other hand, if the amplifier (i.e., the cascode amplifier 500) has a cascode arrangement as shown in FIG. 4, an approximation of $G_{OUT}$=gds$^2$/gm is possible in a band where the frequency of the input signal $V_{IN}$ is relatively low. Thus, by substituting $G_{OUT}$=gds$^2$/gm into (Expression 1), $P_{OUT}$= $(gm/V_{IN})^2 \cdot gm/gds^2$ holds in such a frequency band.

Thus, an amplifier having a cascode arrangement can obtain $P_{out}$ which is greater than that of an amplifier having a single transistor arrangement by a factor of gm/gds. For example, in the case where gm=10 mS and gds=1 mS, an amplifier having the cascode arrangement may obtain an amount of energy which is ten times greater than an amplifier having a single transistor arrangement.

As described above, an amplifier having a cascode arrangement has advantages of reducing the Miller effect and reducing output conductance. Due to these advantages, an amplifier having a cascode arrangement has been widely used.

However, in the case where the frequency of the input signal $V_{IN}$ is 100 MHz or more, there may be a frequency band wherein the output conductance of the semiconductor amplifier circuit 20 is negative. This is because there may be a frequency band wherein the output conductance $G_{OUT}$ of the cascode amplifier 500 is negative.

In the following description, the output conductance $G_{OUT}$ of an amplifier being negative (i.e., $G_{OUT}$<0 holds) will be referred to as "the output conductance $G_{OUT}$ of an amplifier having a negative characteristic".

FIG. 7 illustrates a structure of a small signal equivalent circuit of the cascode amplifier 500. In the example shown in FIG. 7, the transistor 101 and the transistor 102 are assumed to be NMOS transistors of the same size. It is also assumed that the gate of the transistor 102 is grounded via the capacitor $C_1$ in order to reduce the Miller effect. The meanings of the symbols shown in FIG. 7 are as follows.

$C_{gs1}$: Gate-source capacitance of the transistor 101
$C_{gd1}$: Gate-drain capacitance of the transistor 101
$gm_1$: Transconductance of the transistor 101
$gds_1$: Output conductance of the transistor 101
$C_{ds1}$: Drain-source capacitance of the transistor 101
$C_{dsub1}$: Drain-substrate capacitance of the transistor 101
$R_{sub1}$: Substrate resistance from drain to ground of the transistor 101
$C_{gs2}$: Gate-source capacitance of the transistor 102
$C_{gd2}$: Gate-drain capacitance of the transistor 102
$gm_2$: Transconductance of the transistor 102
$gds_2$: Output conductance of the transistor 102
$C_{ds2}$: Drain-source capacitance of the transistor 102

$C_{dsub2}$: Drain-substrate capacitance of the transistor 102

$R_{sub2}$: Substrate resistance from drain to ground of the transistor 102

Assuming that $C_{ds1}=C_{ds2}=0$, the output conductance $G_{OUT}$ of the cascode amplifier 500 is expressed by (Expression 2), in which Re(X) represents a real number portion of X:

$$G_{OUT}=Re(Y_1 \cdot Y_2/(Y_1+Y_2+gM_2))+Re(Y_3) \quad \text{(Expression 2)},$$

where $Y_1$, $Y_2$, and $Y_3$ are represented by (Expression 3), (Expression 4), and (Expression 5), respectively:

$$Y_1 = Y_2 + Y_3 \quad \text{(Expression 3)}$$
$$= gds_2 + j\omega C_{ds2} + j\omega C_{dsub2}/(1 + j\omega C_{ds2}R_{sub2})$$

$$Y_2 = gds_2 + j\omega C_{ds2} \quad \text{(Expression 4)}$$

$$Y_3 = j\omega C_{dsub2}/(1+j\omega C_{ds2}R_{sub2}) \quad \text{(Expression 5)}$$

where $\omega=2\pi f$. Symbol f represents a frequency of the input siganl $V_{IN}$. Symbol j represents an imaginary unit.

FIG. 9 illustrates the results of a simulation of the output conductance $G_{OUT}$ characteristic of the cascode amplifier 500 of the semiconductor amplifier circuit 20. In FIG. 9, the horizontal axis represents the frequency of the input signal $V_{IN}$ and the vertical axis represents the output conductance $G_{OUT}$ of the cascode amplifier 500.

The conditions for the simulation are as follows:

$R_{sub1}=R_{sub2}=10\Omega$ $gds_1=gds_2=1.0$ mS $C_{ds1}=C_{ds2}=0.5$ pF $gm_2=30$ mS $C_{dsub1}=C_{dsub2}=0.5$ pF As will be appreciated from FIG. 9, in a frequency band near 3 GHz, the output conductance $G_{OUT}$ of the cascode amplifier 500 has a negative characteristic.

As shown in FIG. 9, in the case where the output conductance $G_{OUT}$ of the cascode amplifier has a negative characteristic, the operation of the amplifier circuit, including the cascode amplifier, becomes very unstable, whereby the amplifier circuit is likely to oscillate.

A conventional solution to the problem which is known in the art is to stabilize the operation of the amplifier circuit by providing a dumping circuit at the output of the cascode amplifier.

FIG. 10 illustrates a structure of a conventional semiconductor amplifier circuit 30 having a dumping resistor $R_{dump}$ connected to the output of the cascode amplifier 500.

FIG. 11 illustrates the results of a simulation of the output conductance $G_{OUT}$ characteristic of the cascode amplifier 500 of the semiconductor amplifier circuit 30 for each of the dumping resistors $R_{dump}$ having different values.

As will be appreciated from FIG. 11, in the case of $R_{dump}<500\Omega$, the negative characteristic of the output conductance $G_{OUT}$ of the cascode amplifier 500 is eliminated for all frequencies. For example, in the case where the frequency f of the input signal $V_{IN}$ is 1 GHz, the output conductance $G_{OUT}$ is 1.6e-3(S).

However, inserting an actual resistor as a dumping resistor $R_{dump}$ causes a voltage drop due to a DC current. For example, when a direct current of 5 mA flows into the dumping resistor $R_{dump}$ of 500Ω, a voltage drop of 2.5 V results. In this case, if a power supply voltage $V_{dd}$ of the cascode amplifier 500 is assumed to be 3 V, a voltage of only 0.5 V is applied to the transistors 101 and 102 included in the cascode amplifier 500. Under this condition, it is difficult for the semiconductor amplifier circuit 30 to operate normally. It is also difficult to operate the transistors 101 and 102 with a further reduced voltage.

Alternatively, the operation of the amplifier circuit may be stabilized by employing a low-pass filter using an inductor, a capacitor, and a resistor instead of the dumping resistor $R_{dump}$.

However, employing such a low-pass filter leads to an increase in the number of elements required for the amplifier circuit. Arranging a low-pass filter on an integrated circuit (IC) in order to reduce the number of elements causes a significant increase in chip area. Moreover, since it is very difficult to produce a device having a high Q factor on an IC, it is extremely difficult to realize such a filter.

The present invention solves the problems described above, and has an objective of providing a semiconductor amplifier circuit and system having a cascode amplifier wherein the negative characteristic of the output conductance is improved at least in a particular frequency band without causing a voltage drop or an increase in the number of elements.

DISCLOSURE OF THE INVENTION

A semiconductor amplifier circuit of the present invention comprises: a cascode amplifier having a first transistor and a second transistor which are cascaded: and improvement means for improving a negative characteristic of an output conductance of the cascode amplifier at least in a particular frequency band, thereby achieving the above-described object.

The particular frequency band may be a band of 100 MHz or more.

The improvement means may improve the negative characteristic of the output conductance of the cascode amplifier by reducing a real number portion of a gate-source voltage of the second transistor at least in the particular frequency band.

The improvement means may comprise an element which functions as a resistor at least in the particular frequency band, and a gate of the second transistor may be supplied with a predetermined voltage via the element.

The element may function as a resistor of 100Ω or more at least in the particular frequency band.

The element may function as a resistor of 10 kΩ or less at least in the particular frequency band. The semiconductor amplifier circuit may further comprise a high-pass filter connected to an output of the cascode amplifier.

The high-pass filter may be comprised of an inductor and a capacitor.

A system of the present invention may have a receiving section for receiving a signal and the receiving section may comprise the semiconductor amplifier circuit as a low-noise amplifier.

A system of the present invention may have a transmitting section for transmitting a signal and the transmitting section may comprise the semiconductor amplifier circuit as a power amplifier.

BEST MODE FOR CARRYING OUT THE INVENTION

First, the principle of the present invention will be described.

Figure 4:
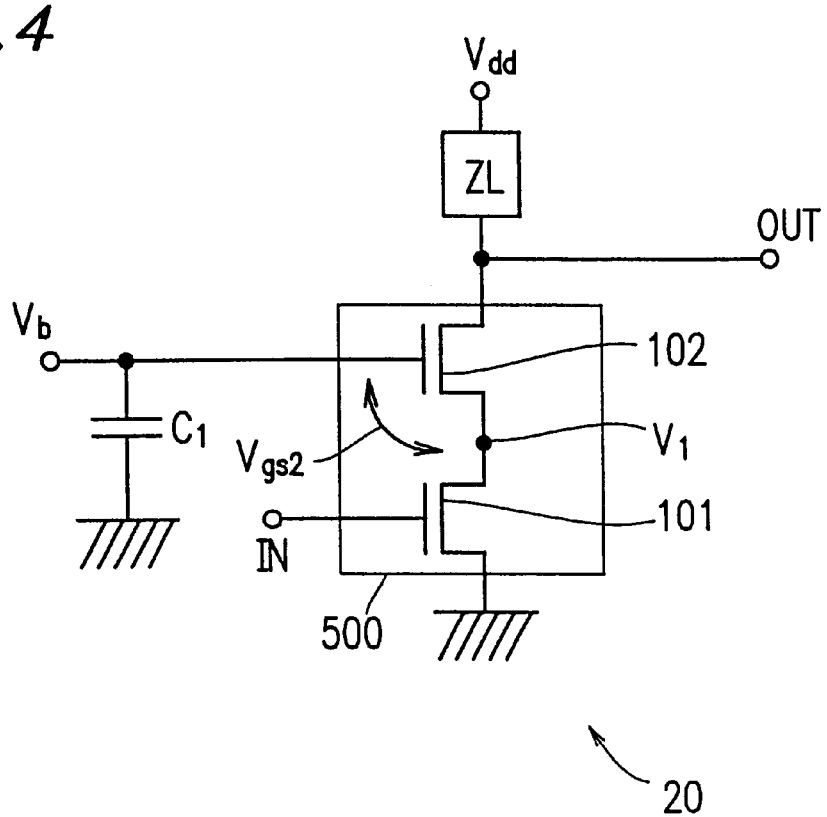
FIG. 4 illustrates an arrangement of a conventional semiconductor amplifier circuit 20.
Figure 5:
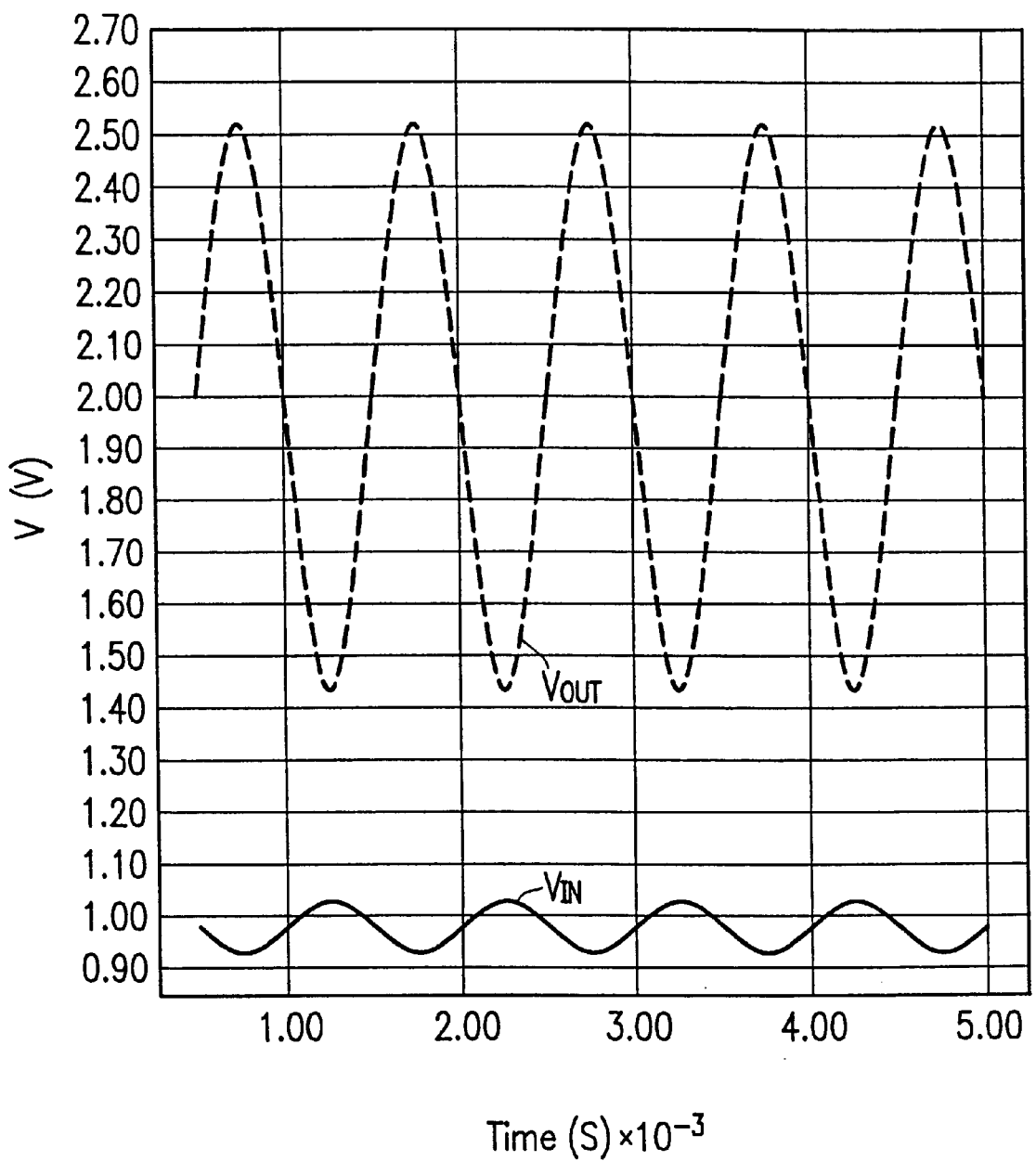
FIG. 5 illustrates the results of a simulation of the operation of the semiconductor amplifier circuit 10.
Figure 6:
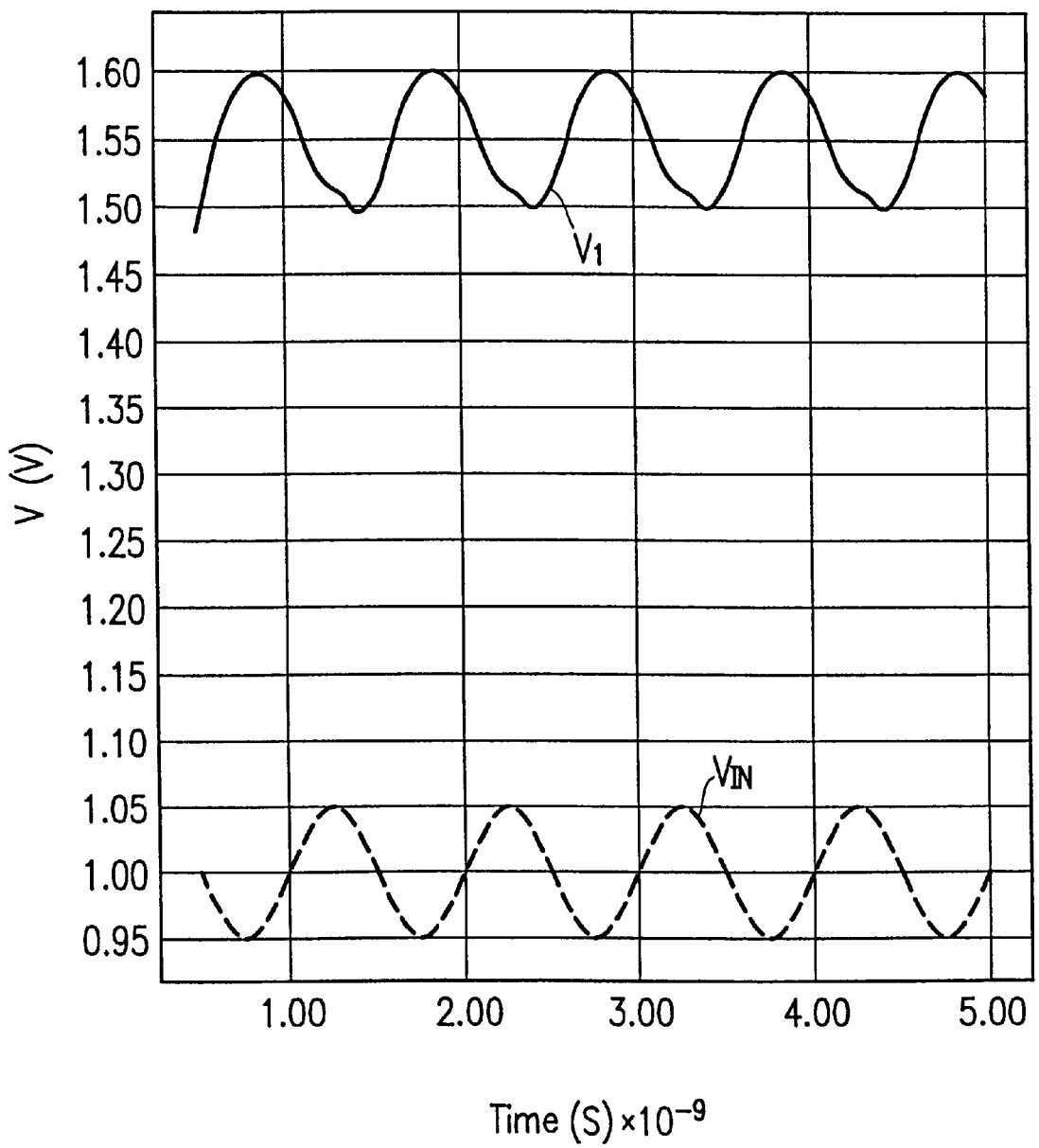
FIG. 6 illustrates the results of a simulation of a drain voltage $V_1$ of a transistor 101 (i.e., a source voltage of a transistor 102).
Figure 7:
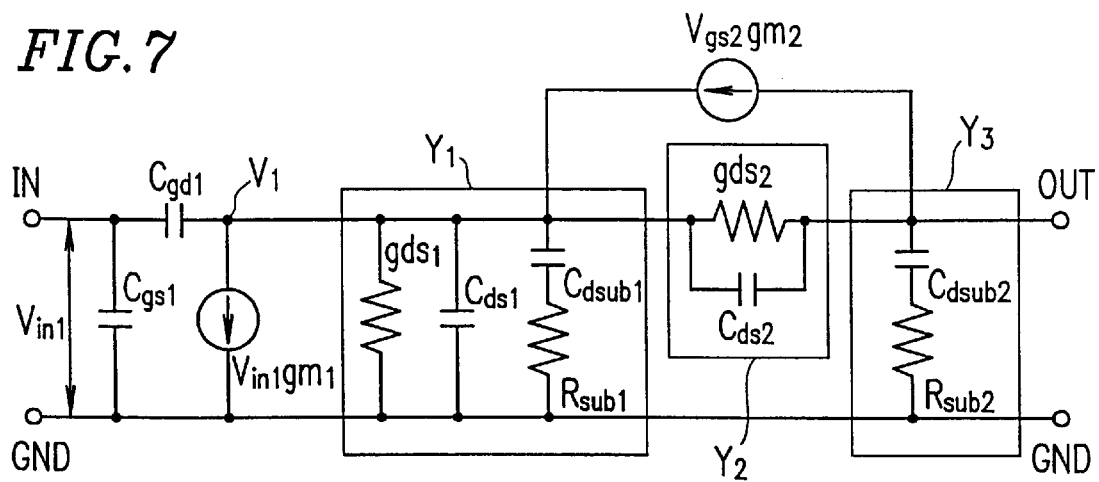
FIG. 7 illustrates an arrangement of a small signal equivalent circuit of a cascode amplifier 500.

An output conductance $G_{OUT}$ of a cascode amplifier 500 of a semiconductor amplifier circuit 20 as shown in FIG. 4 is expressed by (Expression 6) using a gate-drain voltage $V_{gs2}$ of a transistor 102:

$$G_{OUT} = \text{Re}(Y_1 \cdot Y_2/(Y_1+Y_2-(V_{gs2}/V_1)\cdot gm_2)) + \quad \text{(Expression 6)}$$
$$\text{Re}(Y_3)$$
$$= \text{Re}((|Y_1|^2 \cdot Y_2 + |Y_2|^2 \cdot Y_1)/$$
$$|Y_1+Y_2-(V_{gs2}/V_1)\cdot gm_2|^2) +$$
$$\text{Re}(Y_3) + \text{Re}((-Y_1 \cdot Y_2 \cdot (V_{gs2}/V_1) \cdot gm_2)/$$
$$|Y_1+Y_2-(V_{gs2}/V_1)\cdot gm_2|^2)$$

where $Y_1$, $Y_2$ and $Y_3$ are expressed respectively by (Expression 3), (Expression 4), and (Expression 5) shown previously.

The first and second terms of the right side of (Expression 6) are always positive. However, the third term of the right side of (Expression 6) can be negative. In order to ensure that $G_{OUT}$ does not become negative, the absolute value of the third term may be reduced so that the absolute value of the sum of the first term and the second term is larger than the absolute value of the third term. For example, it is possible to ensure that $G_{OUT}$ does not become negative by reducing the real number portion of the gate-drain voltage $V_{gs2}$ of the transistor 102.

Figure 8A:
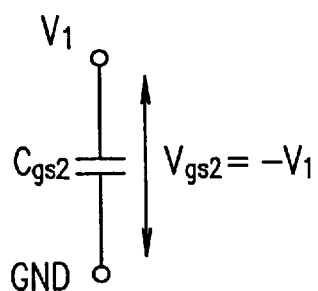
FIG. 8A illustrates an alternating-current equivalent circuit between $V_1$ and $V_b$ in the semiconductor amplifier circuit 20 (FIG. 4).

FIG. 8A illustrates an alternating-current equivalent circuit between $V_1$ and $V_b$ in the semiconductor amplifier circuit 20 shown in FIG. 4. In this case, drain-source voltage $V_{gs2}$ of the transistor 102 is expressed by (Expression 7):

$$V_{gs2}=-V_1 \quad \text{(Expression 7)}$$

where $V_1$ represents a drain voltage of the transistor 101.

Figure 8B:
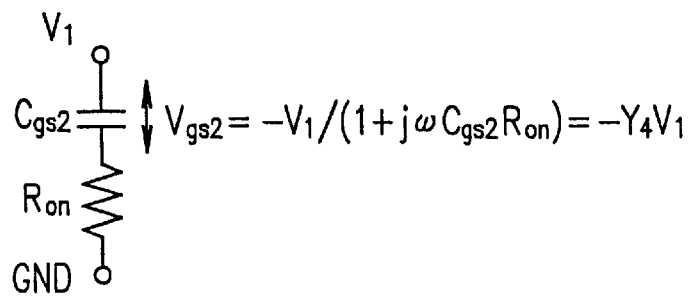
FIG. 8B illustrates an alternating-current equivalent circuit between $V_1$ and $V_b$ in the semiconductor amplifier circuit 1 (FIG. 1).
Figure 9:
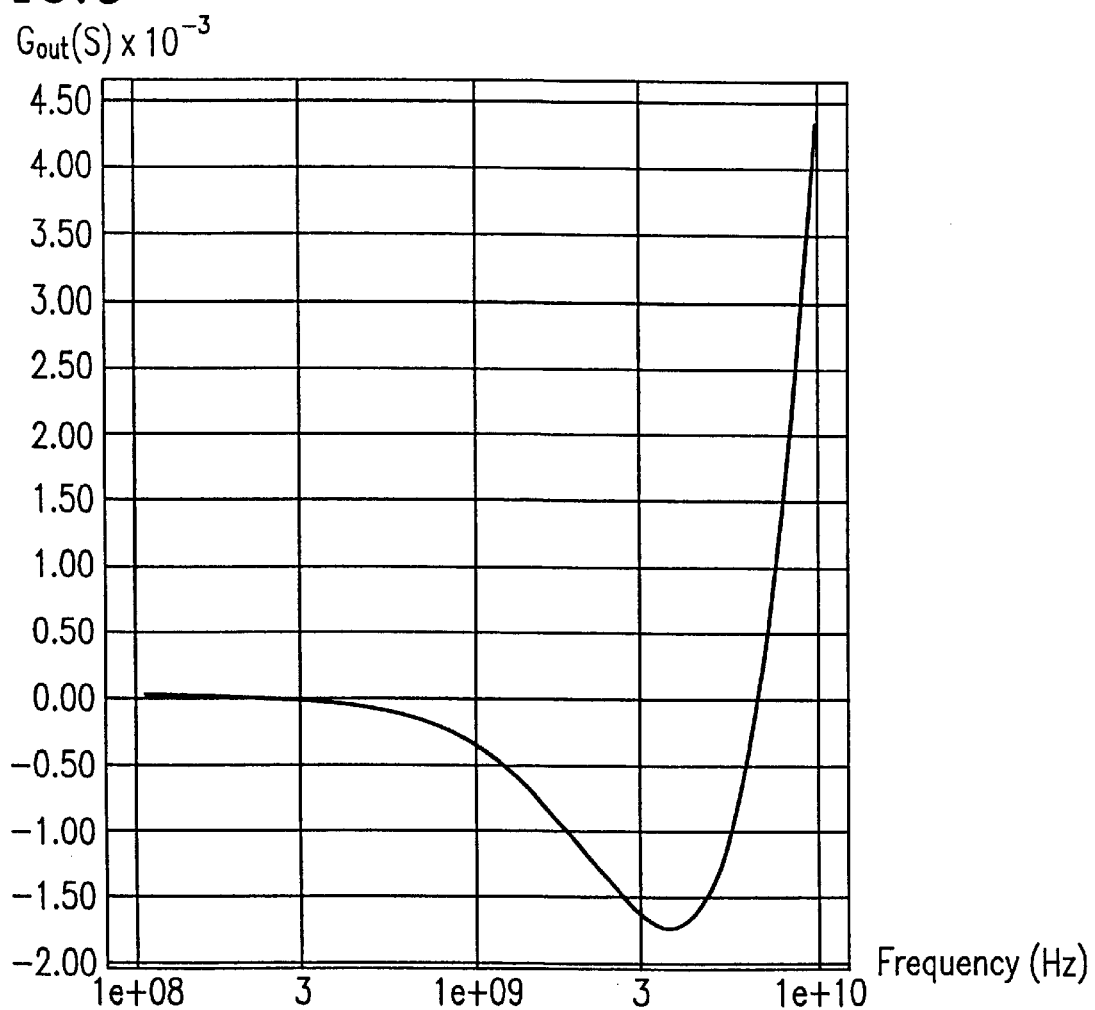
FIG. 9 illustrates the results of a simulation of the output conductance $G_{OUT}$ characteristic of the cascode amplifier 500 of the semiconductor amplifier circuit 20.

FIG. 8B illustrates an alternating-current equivalent circuit between $V_1$ and $V_b$ in the semiconductor amplifier circuit 1 shown in FIG. 1, which will be described later. As shown in FIG. 8B, a resistor $R_{ON}$ is inserted in the alternating-current equivalent circuit between $V_1$ and $V_b$. In this case, the drain-source voltage $V_{gs2}$ of the transistor 102 is expressed by (Expression 8):

$$V_{gs2}=-V_1/(1+j\omega C_{gs2} R_{ON})=-Y_4 \cdot V_1 \quad \text{(Expression 8)}$$

where $V_1$ represents the drain voltage of the transistor 101. $Y_4$ is expressed by (Expression 9):

$$Y_4=1/(1+j\omega C_{gs2} R_{ON}) \quad \text{(Expression 9)}$$

where $C_{gs2}$ represents a gate-source capacitance of the transistor 102 and $R_{ON}$ represents a resistance inserted between a predetermined voltage $V_b$ and a gate of the transistor 102.

By comparing (Expression 7) with (Expression 8), it will be appreciated that the real number portion of $V_{gs2}$ of (Expression 8) is smaller than that of (Expression 7) in a predetermined frequency band (e.g., a high frequency band of 100 MHz or more). This makes it possible to improve the negative characteristic of the output conductance $G_{OUT}$ of the cascode amplifier 500 in the predetermined frequency band (e.g., a high frequency band of 100 MHz or more).

As described above, even in the case where the real number portion of $V_{gs2}$ is reduced in a high frequency band, there remains a negative characteristic of the output conductance $G_{OUT}$ of the cascode amplifier 500 in a low frequency band. Such a negative characteristic of the output conductance $G_{OUT}$ of the cascode amplifier 500 in a low frequency band may be improved by a high-pass filter.

In the case where the load ZL to be connected to an output of the cascode amplifier 500 is comprised of an inductor L and a signal is output through a capacitor C, the inductor L and the capacitor C function as a high-pass filter. Thus, only by adding the capacitor C as a new component it is possible to improve the negative characteristic of the output conductance $G_{OUT}$ of the cascode amplifier 500.

Embodiments of the present invention will now be described with reference to the accompanying drawings.

(Embodiment 1)

Figure 1:
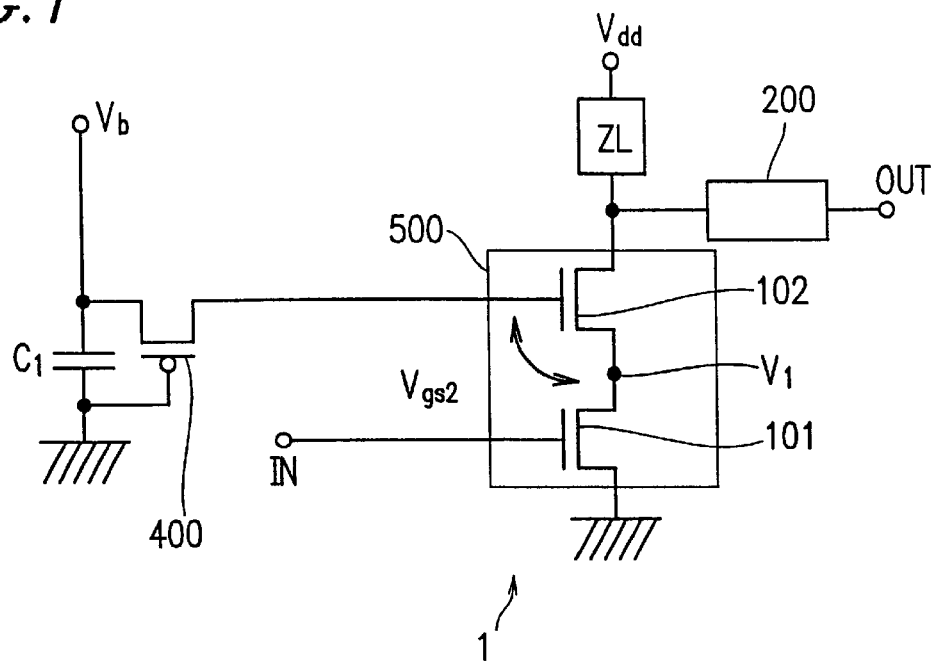
FIG. 1 illustrates an arrangement of a semiconductor amplifier circuit 1 of Embodiment 1 of the present invention.

FIG. 1 illustrates an arrangement of a semiconductor amplifier circuit 1 of Embodiment 1 of the present invention. The semiconductor amplifier circuit 1 has an input terminal IN and an output terminal OUT. The semiconductor amplifier circuit 1 amplifies an input signal $V_{IN}$ input to the input terminal IN and outputs the result to the output terminal OUT as an output signal $V_{OUT}$.

The semiconductor amplifier circuit 1 includes a cascode amplifier 500. The cascode amplifier 500 includes a transistor 101 and a transistor 102 which are cascaded. The transistor 101 and the transistor 102 are nMOS transistors, for example.

The gate of the transistor 101 is connected to the input terminal IN of the semiconductor amplifier circuit 1. The source of the transistor 101 is grounded. The drain of the transistor 101 is connected to the source of the transistor 102.

The gate of the transistor 102 is supplied with a fixed voltage $V_b$ via a transistor 400. The transistor 400 is provided in order to provide an ON resistor $R_{ON}$ between the fixed voltage $V_b$ and the gate of the transistor 102. The ON resistor $R_{ON}$ functions as an improvement means for improving the negative characteristic of the output conductance of the cascode amplifier 500. The transistor 400 is, for example, a pMOS transistor. The fixed voltage $V_b$ is supplied, for example, from a DC power supply (not shown). A bypass capacitor $C_1$ is provided for removing the AC component of the voltage $V_b$ supplied from the DC power supply.

The improvement means for improving the negative characteristic of the output conductance of the cascode amplifier 500 may be any type of element so long as the element functions as a resistor at least in a particular frequency band (e.g., a high frequency band of 100 MHz or more). Preferably, the element functions as a resistor of 100Ω or more (preferably 1 kΩ or more) at least in a particular frequency band. When the resistance value is too large, there may be an influence of the Miller effect and/or an increase in the device size. Therefore, the device preferably functions as a resistor of 10 kΩ or less at least in a particular frequency band.

For example, the improvement means may be either the ON resistor $R_{ON}$ of the transistor inserted between the fixed voltage $V_b$ and the gate of the transistor 102 or any resistor other than the ON resistor $R_{ON}$ of the transistor. Such a resistor has a resistance value greater than the wiring resistance, and thus can be clearly distinguished from the wiring resistance. This is because the wiring resistance is usually less than 1Ω.

The source of the transistor 102 is connected to the drain of the transistor 101. The drain of the transistor 102 is connected to an output terminal OUT of the semiconductor amplifier circuit 1 via a high-pass filter 200. The drain of the transistor 102 is also supplied with a power supply voltage $V_{dd}$ via the load ZL.

In FIG. 1, $V_1$ represents a drain voltage of the transistor 101 (i.e., a source voltage of a transistor 102) and $V_{gs2}$ represents a gate-source voltage of the transistor 102.

As is already described with reference to FIG. 8B, the gate-source voltage $V_{gs2}$ of the transistor 102 is expressed by (Expression 8).

By substituting (Expression 8) into (Expression 6), (Expression 10) is obtained. Thus, the output conductance $G_{OUT}$ of the cascode amplifier 500 of the semiconductor amplifier circuit 1 is expressed by (Expression 10):

$$G_{OUT}=Re(Y_1 \cdot Y_2/(Y_1+Y_2+Y_4 \cdot gm_2))+Re(Y_3) \quad \text{(Expression 10)}$$

where $Y_1$, $Y_2$, and $Y_3$ are expressed respectively by (Expression 3), (Expression 4), and (Expression 5) shown previously. $Y_4$ is expressed by (Expression 9) shown above.

Figure 10:
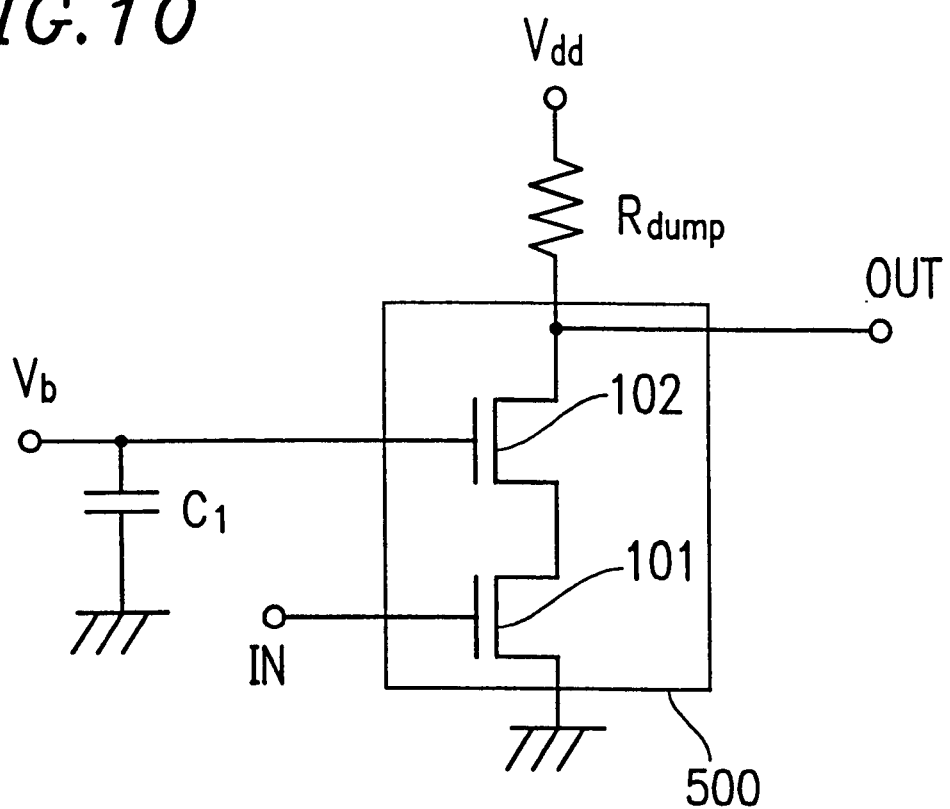
FIG. 10 illustrates an arrangement of a conventional semiconductor amplifier circuit 30.
Figure 11:
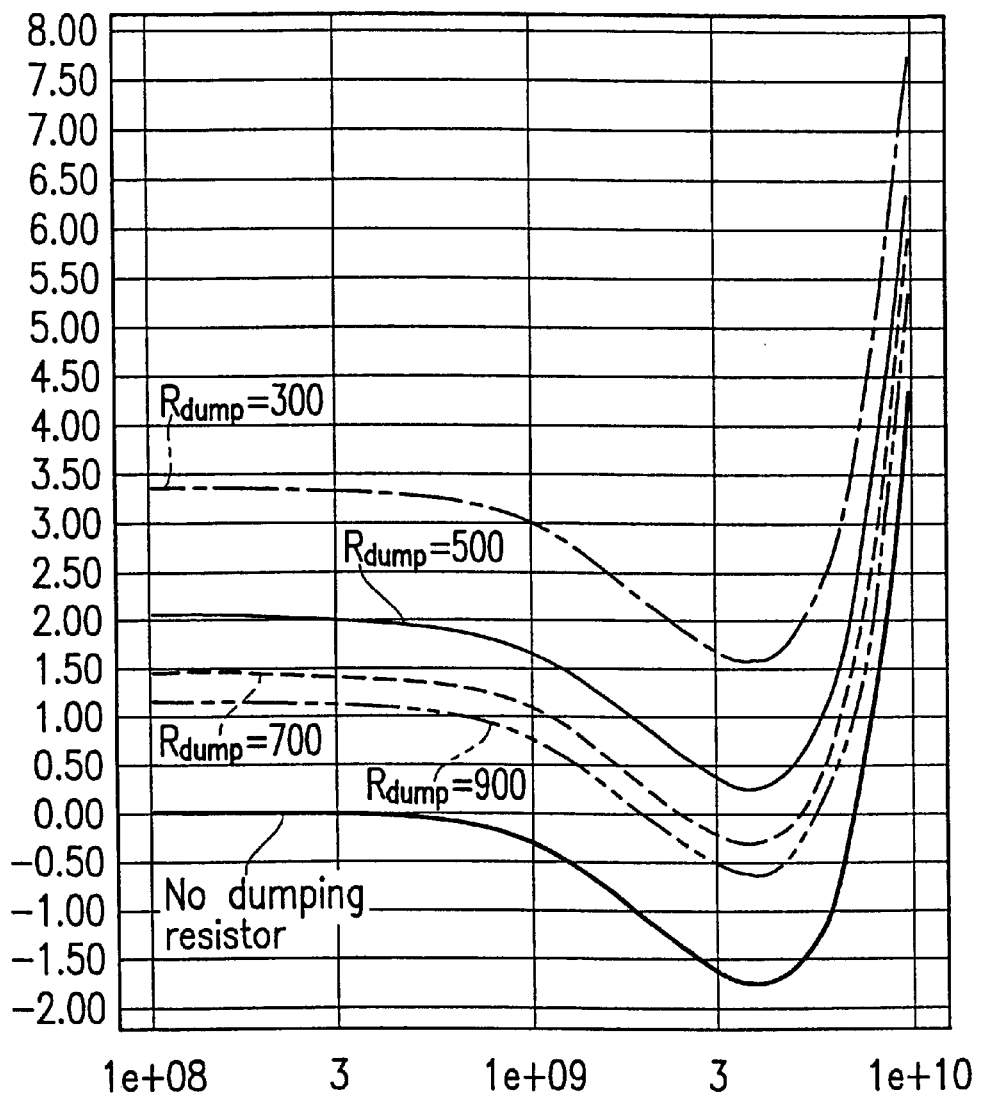
FIG. 11 illustrates the results of a simulation of the output conductance $G_{OUT}$ characteristic of the cascode amplifier 500 of the semiconductor amplifier circuit 30.
Figure 12:
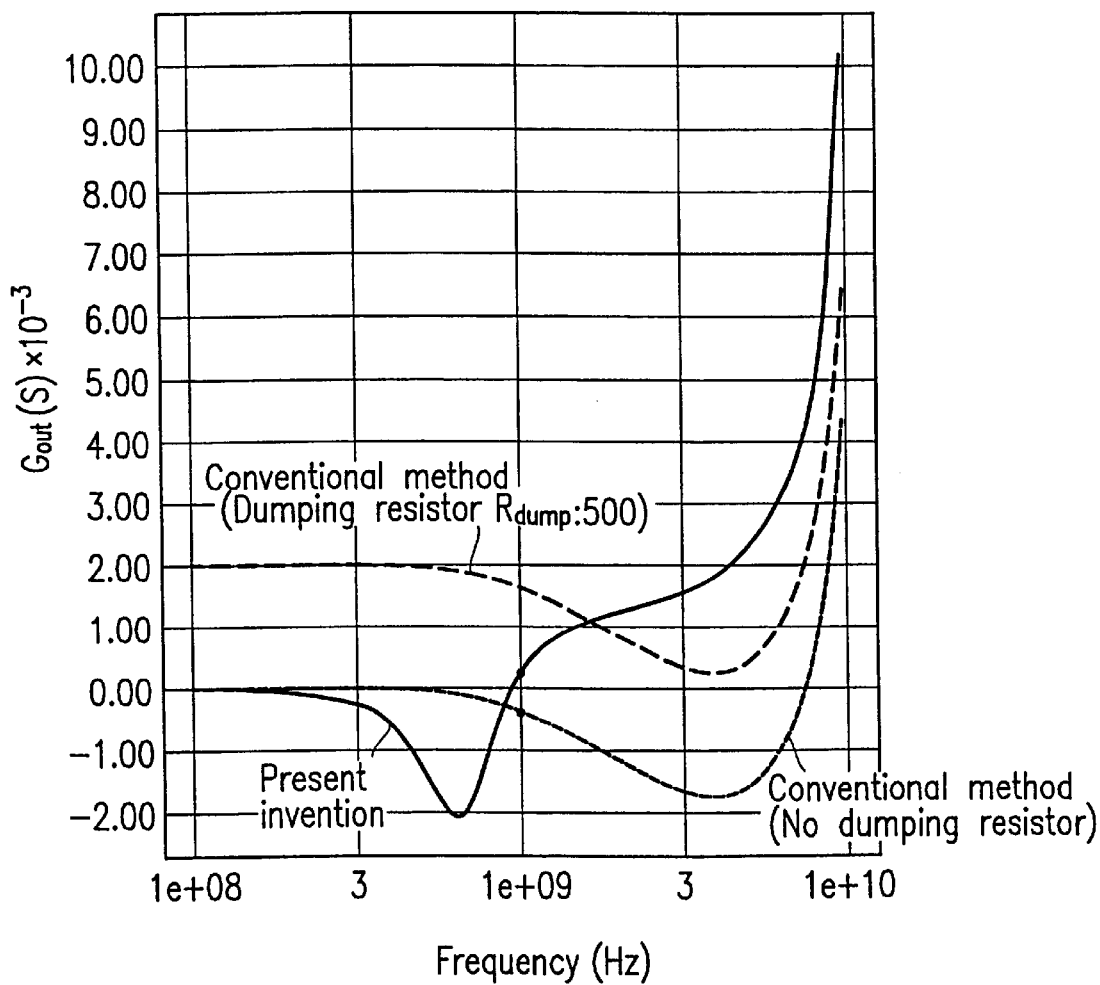
FIG. 12 illustrates the results of a simulation of the output conductance $G_{OUT}$ of the cascode amplifier 500 in the case of $R_{ON}$=1 kΩ.

FIG. 12 illustrates the results of a simulation of the output conductance $G_{OUT}$ of the cascode amplifier 500 in the case of $R_{ON}=1$ kΩ using (Expression 10). In FIG. 12, the horizontal axis represents the frequency f of the input signal $V_{IN}$ and the vertical axis represents the output conductance $G_{OUT}$ of the cascode amplifier 500. FIG. 12 illustrates, for comparison, $G_{OUT}$ in the case of $R_{ON}=0Ω$ and $G_{OUT}$ in the case of $R_{dump}=500Ω$ according to a conventional method (FIG. 10).

The conditions for the simulation include $gm_1=gm_2=30$ mS, $C_{gs1}=C_{gs2}=1$ pF, and $gds_1=gds_2=1$ mS.

As shown in FIG. 12, f=1 GHz and $G_{OUT} \geqq 0$ in the case of $R_{ON}=1$ kΩ. The value of $G_{OUT}$ for f=1 GHz is less than that for $R_{dump}=500Ω$ according to the conventional method (FIG. 10) by a factor of about 7. This means that it is possible to obtain a maximum power which is seven times greater than that obtained in the case of $R_{dump}=500Ω$ according to the conventional method (FIG. 10).

FIG. 12 shows that, even when $R_{ON}=1$ kΩ, $G_{OUT}<0$ may possibly hold in a frequency band in which the frequency f of the input signal $V_{IN}$ is small. The negative characteristic of the output conductance $G_{OUT}$ of such a cascode amplifier 500 may be removed by the high-pass filter 200. Specifically, the high-pass filter 200 may be configured such that a signal output from the cascode amplifier 500 is allowed to pass therethrough only for a frequency band where $G_{OUT} \geqq 0$ holds.

Figure 13:
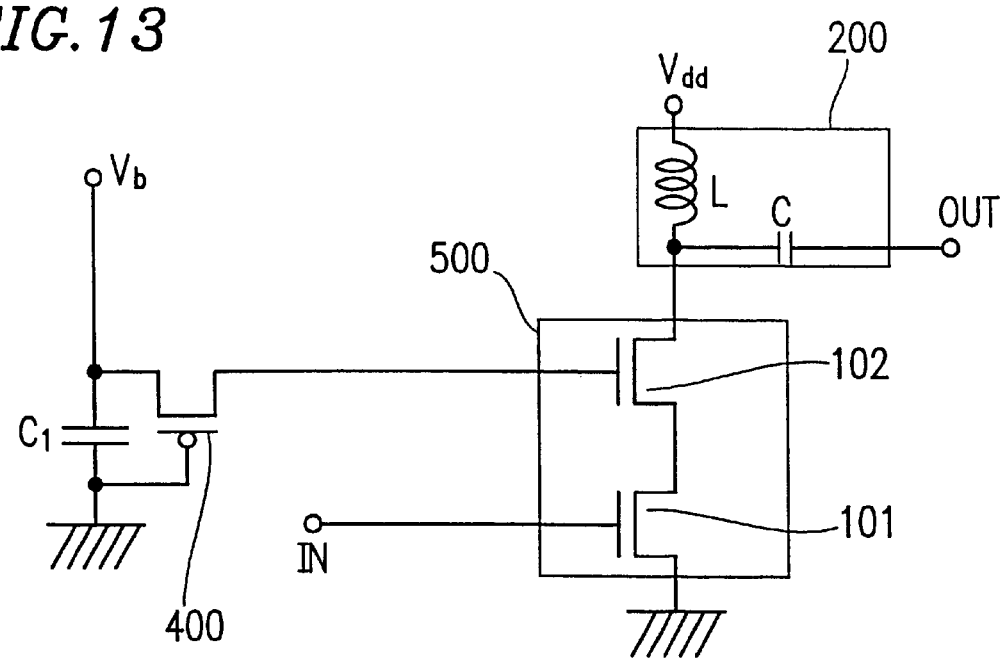
FIG. 13 illustrates an arrangement of the semiconductor amplifier circuit 1 in the case where the load ZL is comprised of an inductor L and a signal is output through a capacitor C.

Normally in a high frequency amplifier, the load ZL is comprised of an inductor L, as shown in FIG. 13, and a signal is output after DC removal through a capacitor C. The inductor L and the capacitor C function as the high-pass filter 200. In this case, the high-pass filter 200 may be arranged by only adding the capacitor C as a new component. Thus, as compared with the conventional method, it is possible to minimize an increase in the number of components of the semiconductor amplifier circuit 1.

Figure 14:
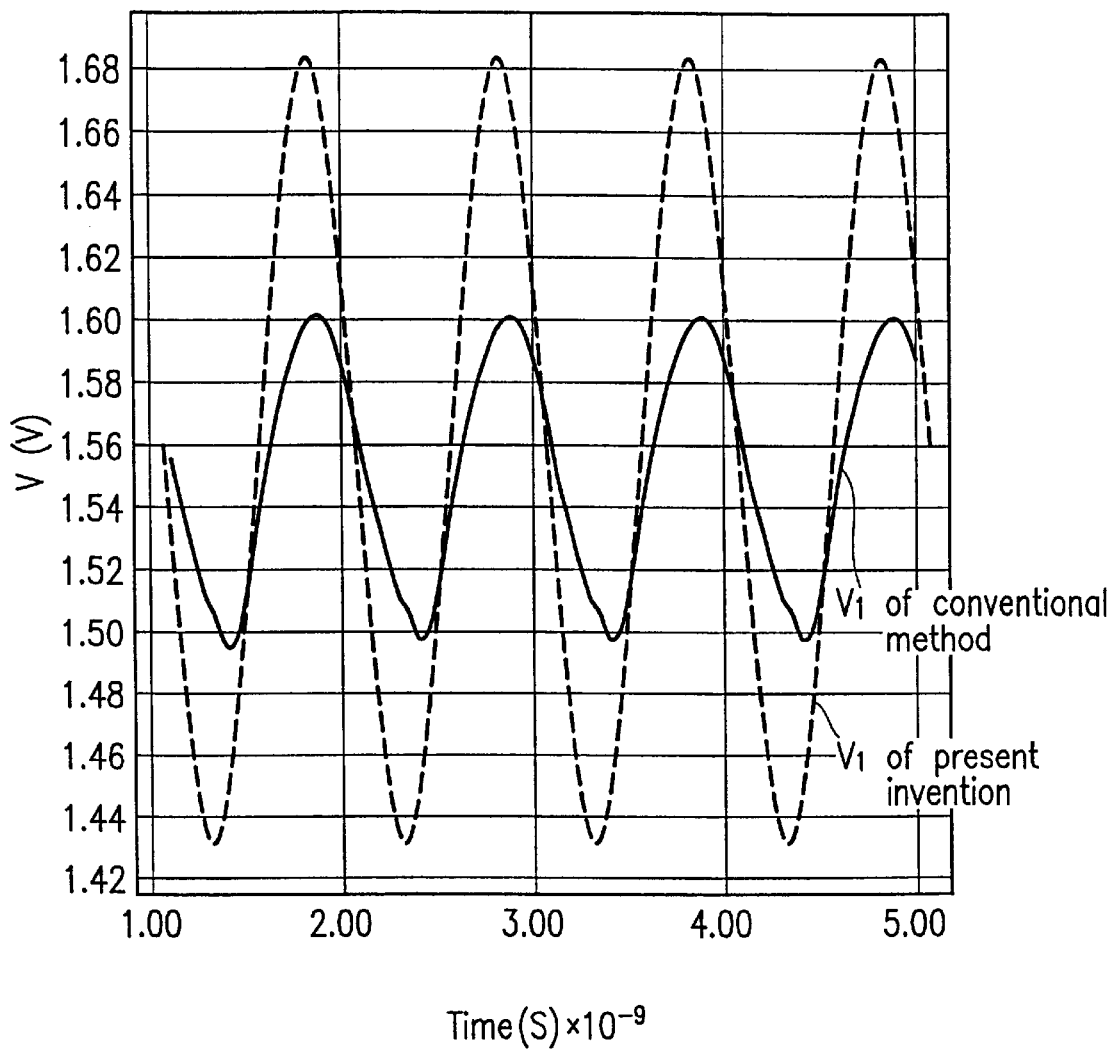
FIG. 14 illustrates a comparison between the amplitude of a voltage $V_1$ in the case where an ON resistor $R_{ON}$ is inserted and that in the case where the ON resistor $R_{ON}$ is not inserted.

When the ON resistor $R_{ON}$ is inserted, as shown in FIG. 14, the amplitude of the voltage $V_1$ is greater than that obtained when the ON resistor $R_{ON}$ is not inserted by a factor of about 2.5. However, the influence of the Miller effect due to the increase in the amplitude of the voltage $V_1$ is substantially negligible. This is because an increase in the amplitude of the voltage $V_1$ is very small.

As described above, in the semiconductor amplifier circuit 1, the resistor $R_{ON}$ is inserted between the fixed voltage $V_b$ and the gate of the transistor 102. The resistor $R_{ON}$ enables one to reduce the real number portion of the gate-source voltage $V_{gs2}$ of the transistor 102 in a high frequency band. Thus, it is possible to improve the negative characteristic of the output conductance $G_{OUT}$ of the cascode amplifier 500 so that the output conductance $G_{OUT}$ of the cascode amplifier 500 does not become negative at least in a particular frequency band.

In addition, by providing the high-pass filter 200 connected to the output of the cascode amplifier 500, it is possible to improve the negative characteristic of the output conductance $G_{OUT}$ of the cascode amplifier 500 in a low frequency band.

In the case where the load ZL to be connected to the output of the cascode amplifier 500 is comprised of the inductor L and a signal is output after cutting off the DC component thereof through the capacitor C, the inductor L and the capacitor C function as the high-pass filter 200. Thus, it is possible to improve the negative characteristic of the output conductance $G_{OUT}$ of the cascode amplifier 500 by only adding the capacitor C as a new component.

(Embodiment 2)

Figure 2:
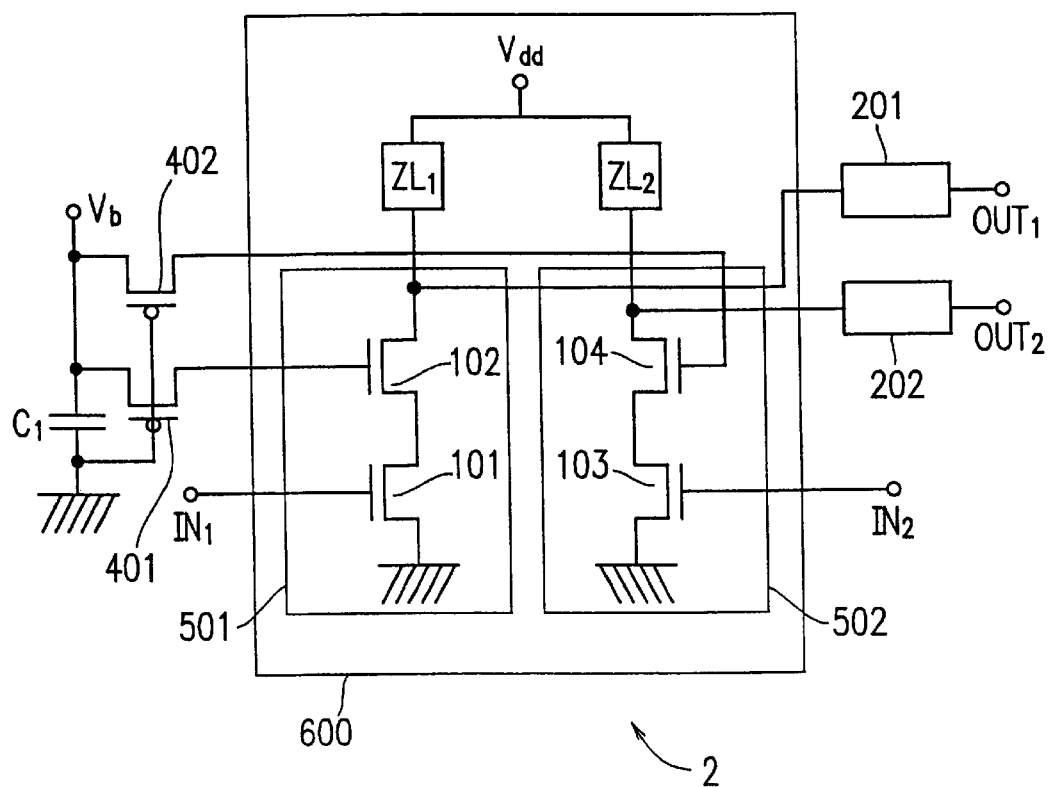
FIG. 2 illustrates an arrangement of a semiconductor amplifier circuit 2 of Embodiment 2 of the present invention.
Figure 3:
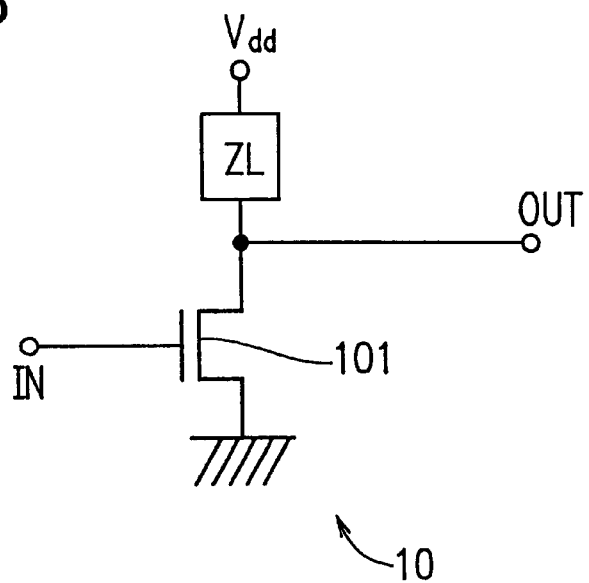
FIG. 3 illustrates an arrangement of a conventional semiconductor amplifier circuit 10.

FIG. 2 illustrate the arrangement of a semiconductor amplifier circuit 2 of Embodiment 2 of the present invention. The semiconductor amplifier circuit 2 is obtained by applying the above-described principle of the present invention to a differential amplifier.

The semiconductor amplifier circuit 2 includes input terminals $IN_1$ and $IN_2$ and output terminals $OUT_1$ and $OUT_2$. The semiconductor amplifier circuit 2 amplifies the difference between an input signal $V_{IN1}$ input to the input terminal $IN_1$ and an input signal $V_{IN2}$ input to the input terminal $IN_2$, and outputs the result as output signals $V_{OUT1}$ and $V_{OUT2}$ to the output terminals $OUT_1$ and $OUT_2$, respectively.

The semiconductor amplifier circuit 2 includes a differential amplifier 600 which uses cascode amplifiers 501 and 502 for the differential operation. The cascode amplifier 501 includes transistors 101 and 102 which are cascaded to each other. The cascode amplifier 502 includes transistors 103 and 104 which are cascaded to each other. Each of the transistors 101, 102, 103 and 104 is, for example, an nMOS transistor.

The arrangement of each of the cascode amplifiers 501 and 502 is similar to that of the cascode amplifier 500 shown in FIG. 1.

The gate of the transistor 101 is connected to the input terminal $IN_1$ of the semiconductor amplifier circuit 2.

The gate of the transistor 102 is supplied with the fixed voltage $V_b$ via a transistor 401. The transistor 401 is, for example, a pMOS transistor. The drain of the transistor 102 is connected to an output terminal $OUT_1$ of the semiconductor amplifier circuit 2 via a high-pass filter 201. The drain of the transistor 102 is supplied with a power supply voltage $V_{dd}$ via a load $ZL_1$.

The gate of the transistor 103 is connected to the input terminal $IN_2$ of the semiconductor amplifier circuit 2.

The gate of the transistor 104 is supplied with the fixed voltage $V_b$ via a transistor 402. The transistor 402 is, for example, a pMOS transistor. The drain of the transistor 104 is connected to an output terminal $OUT_2$ of the semiconductor amplifier circuit 2 via a high-pass filter 202. The drain of the transistor 104 is supplied with the power supply voltage $V_{dd}$ via a load $ZL_2$.

A resistor inserted between the fixed voltage $V_b$ and each of the gates of the transistors 102 and 104 may be any type of resistor.

Using the semiconductor amplifier circuit 2, it is possible to obtain effects similar to those obtained by the semiconductor amplifier circuit 1.

Now, a modified example common to Embodiment 1 and Embodiment 2 will be described.

The semiconductor amplifier circuits 1 and 2 do not necessitate the development of a new process. A pMOS transistor to be used as each of the transistors 400, 401 and 402 may be easily realized on an IC.

In this way, it is possible to produce a semiconductor amplifier circuit having reduced cost, reduced noise, increased gain, and reduced distortion.

The types of amplifiers, and the values of frequency, capacitor, and resistor employed in Embodiments 1 and 2 above are merely exemplary. Needless to say, the present invention is not limited to these particular types and values.

The resistor $R_{ON}$ may be a polysilicon resistor, a diffused resistor, or the like, as well as an ON resistor of a transistor.

The transistor included in a cascade amplifier may be a pMOS transistor, a bipolar transistor, a GaAsFET, or the like, as well as an nMOS transistor.

In addition to, or in place of, the resistor $R_{ON}$, a combination of an inductance and a capacitance may be used to improve the negative characteristic of the output conductance $G_{OUT}$ of the cascode amplifier 500 (or the cascode amplifier 600).

Figure 15:
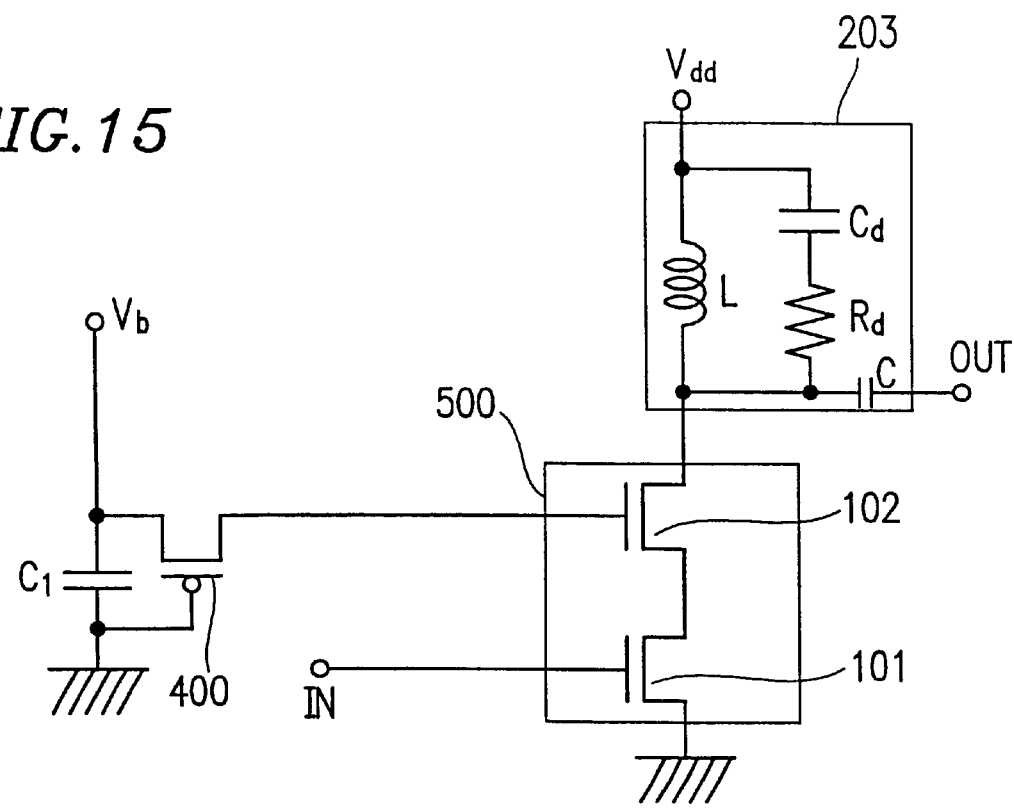
FIG. 15 illustrates an arrangement of a high-pass filter 203.

In addition, a filter connected to the output of the cascode amplifier 500 may be a band-pass filter 203 as shown in FIG. 15. The band-pass filter 203 includes an inductor L, capacitors $C_d$ and C and a resistor $R_d$. The band-pass filter 203 can be easily arranged on an IC.

Similarly, a band-pass filter may be connected to the output of the cascode amplifier 600.

The present invention significantly contributes to obtaining a high performance semiconductor circuit and is therefore highly useful.

(Embodiment 3)

Figure 16:
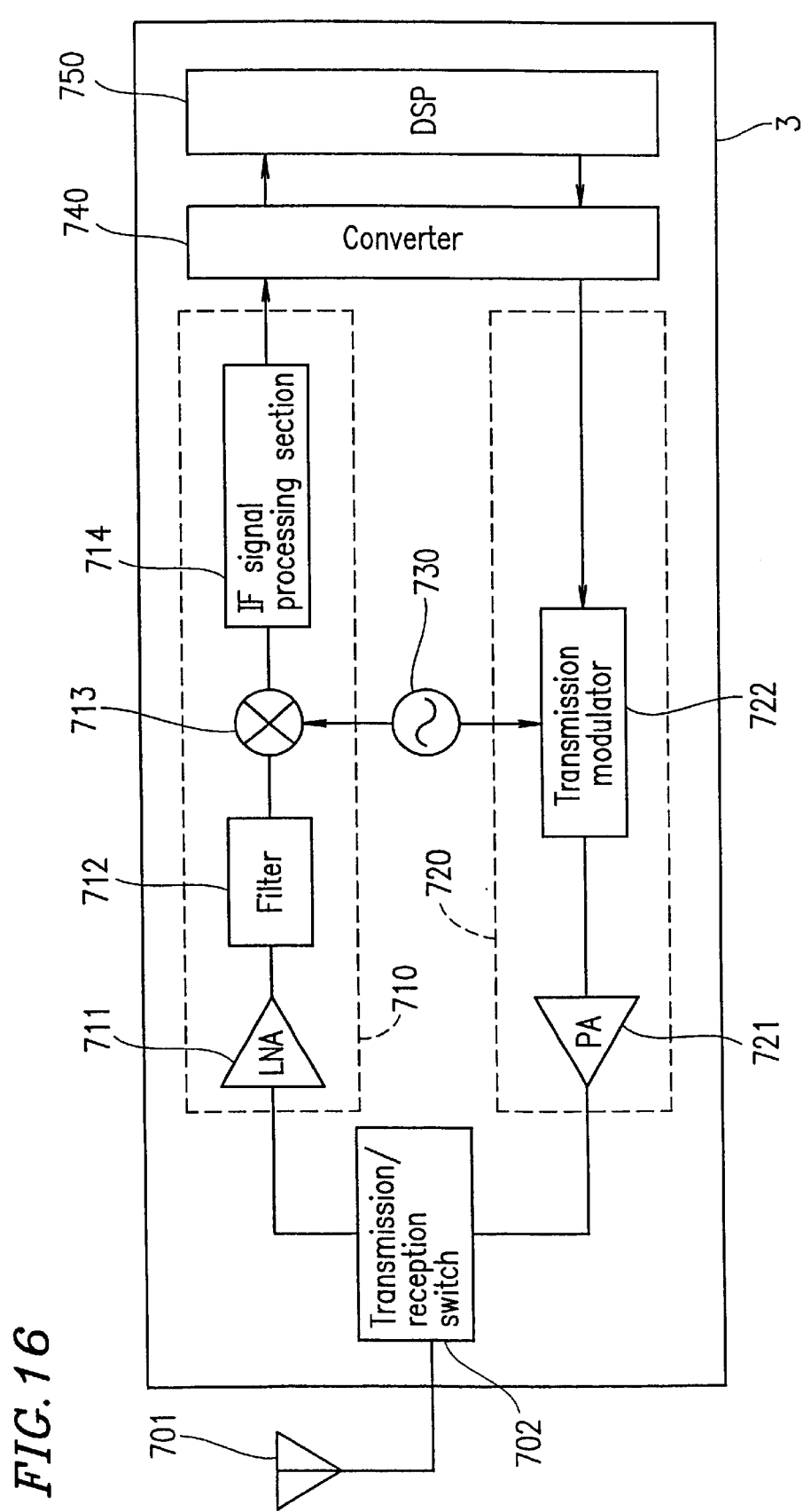
FIG. 16 illustrates an arrangement of a system 3 of Embodiment 3 of the present invention.

FIG. 16 illustrates an arrangement of a communication system 3 of Embodiment 3 of the present invention. The communication system 3 includes: a transmission/reception switch 702 for switching between a connection between an antenna 701 and a receiving section 710 and a connection between the antenna 701 and a transmitting section 720 in response to a signal transmission/reception switching timing; the receiving section 710 for receiving a signal from the antenna 701 via the transmission/reception switch 702; the transmitting section 720 for outputting a signal to the antenna 701 to be transmitted via the transmission/reception switch 702: a frequency synthesizer 730 for outputting an oscillating signal having a predetermined frequency to the receiving section 710 and the transmitting section 720; a converter 740; and a digital signal processor (DSP) 750.

The receiving section 710 includes a low noise amplifier (LNA) 711, a filter 712, a mixer 713, and an IF signal processing section 714.

A signal received by the antenna 701 is input to the low noise amplifier (LNA) 711 in the receiving section 710 via the transmission/reception switch 702. The LNA 711 amplifies the received signal. The amplified signal is input to the mixer 713 via the filter 712. The mixer 713 mixes the signal output from the filter 712 with the oscillating signal output from the frequency synthesizer 730. The output from the mixer 713 is supplied to the converter 740 via the IF signal processing section 714.

The converter 740 converts an analog signal output from the IF signal processing section 714 into a digital signal. The DSP 750 processes the digital signal.

The digital signal which has been processed by the DSP 750 is converted into an analog signal by the converter 740.

The transmitting section 720 includes a power amplifier (PA) 721 and a transmission modulator 722.

The transmission modulator 722 mixes the signal output from the converter 740 with the oscillating signal output from the frequency synthesizer 730. The power amplifier (PA) 721 amplifies the output from the transmission modulator 722. The amplified signal is transmitted from the antenna 701 via the transmission/reception switch 702.

The semiconductor amplifier circuit 1 (FIG. 1) may be used as the LNA 711 in the receiving section 710 or the PA 721 in the transmitting section 720. Since the semiconductor amplifier circuit 1 can provide a large amount of electric power as an output therefrom, the semiconductor amplifier circuit 1 is suitable as the LNA 711 or the PA 721. Thus, by using the semiconductor amplifier circuit 1 as the LNA 711 or the PA 721, it is possible to obtain the LNA 711 or the PA 721 having a cascade amplifier in which the negative characteristic of the output conductance is improved at least in a particular frequency band.

Industrial Applicability

A semiconductor amplifier circuit according to the present invention includes a cascode amplifier having a first transistor and a second transistor which are cascaded, and improvement means for improving the negative characteristic of the output conductance of the cascode amplifier at least in a particular frequency band. The improvement means enables one to improve the negative characteristic of the output conductance of the cascode amplifier so that the output conductance of the cascode amplifier does not become negative at least in a particular frequency band.

In addition, by providing a high-pass filter connected to the output of the cascode amplifier, it is possible to improve the negative characteristic of the output conductance of the cascode amplifier in a low frequency band.

In the case where a load connected to the output of the cascode amplifier is comprised of an inductor and a signal is output through a capacitor, the inductor and the capacitor function as a high-pass filter. Thus, by only adding a capacitor as a new element, it is possible to improve the negative characteristic of the output conductance of the cascode amplifier.

The semiconductor amplifier circuit according to the present invention may be suitably used as a low-noise amplifier in a transmitting section of a communication system. Additionally, the semiconductor amplifier circuit according to the present invention may be suitably used as a power amplifier in a receiving section of the communication system.

What is claimed is:

1. A semiconductor amplifier circuit, comprising:
   a cascode amplifier having a first transistor and a second transistor which are cascaded; and
   improvement means for improving a negative characteristic of an output conductance of the cascode amplifier at least in a particular frequency band,
   wherein the improvement means,
      comprises an element which functions as a resistor at least in a particular frequency band,
      is configured to reduce a real number portion of a gate-source voltage of the second transistor,
      and wherein the second transistor gate is coupled to the element such that the first transistor gate is independent of the second transistor gate and the element.

2. A semiconductor amplifier circuit according to claim 1, wherein the particular frequency band is a band of 100 MHz or more.

3. A semiconductor amplifier circuit according to claim 1, wherein the element functions as a resistor of 100Ω or more at least in the particular frequency band.

4. A semiconductor amplifier circuit according to claim 1, wherein the element functions as a resistor of 10 kΩ or less at least in the particular frequency band.

5. A semiconductor amplifier circuit according to claim 1, further comprising a high-pass filter connected to an output of the cascode amplifier.

6. A semiconductor amplifier circuit according to claim 5, wherein the high-pass filter is comprised of an inductor and a capacitor.

* * * * *